US008039347B2

(12) United States Patent
Shin et al.

(10) Patent No.: US 8,039,347 B2
(45) Date of Patent: Oct. 18, 2011

(54) SEMICONDUCTOR DEVICE HAVING VERTICALLY ALIGNED PILLAR STRUCTURES THAT HAVE FLAT SIDE SURFACES AND METHOD FOR MANUFACTURING THE SAME

(75) Inventors: Jong Han Shin, Seoul (KR); Hyung Soon Park, Gyeonggi-do (KR); Jum Yong Park, Gyeonggi-do (KR); Sung Jun Kim, Gyeonggi-do (KR); Young Ju Lee, Seoul (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 176 days.

(21) Appl. No.: 12/491,565

(22) Filed: Jun. 25, 2009

(65) Prior Publication Data

US 2010/0096691 A1 Apr. 22, 2010

(30) Foreign Application Priority Data

Oct. 22, 2008 (KR) ........................ 10-2008-0103741

(51) Int. Cl.
*H01L 21/336* (2006.01)

(52) U.S. Cl. ... 438/270; 438/589; 438/156; 257/E21.429
(58) Field of Classification Search .................. 257/302, 257/E21.429, E21.294, E21.621; 438/270, 438/272, 242, 589, 156
See application file for complete search history.

(56) References Cited

U.S. PATENT DOCUMENTS

| 7,935,598 B2 * | 5/2011 | Lee ............................... 438/268 |
| 2006/0097304 A1 * | 5/2006 | Yoon et al. .................... 257/307 |

FOREIGN PATENT DOCUMENTS

| KR | 1020030019639 A | 3/2003 |
| KR | 1020070091833 A | 9/2007 |

* cited by examiner

*Primary Examiner* — Victor A Mandala
*Assistant Examiner* — Scott Stowe
(74) *Attorney, Agent, or Firm* — Ladas & Parry LLP

(57) ABSTRACT

A semiconductor device having vertically aligned transistors made from pillar structures that have flat side surfaces is presented. The semiconductor device includes a semiconductor substrate, spacers, and gates. The semiconductor substrate has pillar structures that have flat side surfaces. The spacers are on sidewalls only on the upper portions of the pillar structures. The gates surround lower portions of the pillar structures.

11 Claims, 7 Drawing Sheets

SEMICONDUCTOR DEVICE HAVING VERTICALLY ALIGNED PILLAR STRUCTURES THAT HAVE FLAT SIDE SURFACES AND METHOD FOR MANUFACTURING THE SAME

CROSS-REFERENCE TO RELATED APPLICATIONS

The present application claims priority to Korean patent application number 10-2008-0103741 filed on Oct. 22, 2008, which is incorporated herein by reference in its entirety.

BACKGROUND OF THE INVENTION

The present invention relates to a semiconductor device and a method for manufacturing the same, and more particularly, to a semiconductor device that can stabilize a process for forming a vertical transistor, thereby improving the characteristics and the reliability of a semiconductor device, and a method for manufacturing the same.

As the integration level of a semiconductor device increases, the area that is occupied by each unit cell decreases when viewed from above. Corresponding to the need to decrease in the area of the unit cell, various alternate methods for forming transistors, bit lines and capacitors within these diminished areas have been researched. In one approach, a semiconductor device having the structure of a transistor, hereinafter referred to as a "vertical transistor", has been proposed. The vertical transistor has a source area and a drain area positioned up and down in an active region that defines a vertical channel in a semiconductor substrate.

Hereafter, a conventional method for manufacturing a semiconductor device having a vertical transistor will be briefly described.

After sequentially forming an oxide layer and a nitride layer on a semiconductor substrate, the nitride layer and the oxide layer are selectively etched to expose portions of the semiconductor substrate. Then, by using anisotropically etching and using the etched nitride layer as an etch mask barrier, the exposed portions of the semiconductor substrate are etched at a predetermined depth to define first grooves in the semiconductor substrate.

After forming spacers on the sidewalls of the nitride layer and using the etched nitride layer and the spacers as etch mask barriers, the oxide layer and the first grooves are isotropically etched at the bottoms of the first grooves to define second grooves under the first grooves. As a result, the second grooves have a larger width than the first grooves. As a consequence, (hereinafter referred to as a "pillar structures") are formed which are delimited by the first and second grooves and have neck parts on lower portions thereof due to the formation of the second grooves.

Gates are subsequently formed to surround the lower portions of the pillar structures which define the second grooves. Thereafter source areas and drain areas are respectively formed in the upper and lower portions of the pillar structures with respect to the gates. As a result vertical transistors are formed that have channels aligned vertically with respect to the main surface of the semiconductor substrate.

In the conventional technique in fabricating vertical transistors, the nitride layer is employed as a barrier at least three times in a subsequent etching process and CMP (chemical mechanical polishing) process. Because of this, in order to secure an effective processing margin, the nitride layer should be formed at a thickness equal to or greater than about 1,500 Å. As a result, of this very thick nitride layer, the pillar structures including the nitride layer prone to leaning while undergoing any number of subsequent processes.

Conventional techniques in fabricating vertical transistors also suffer from voids being formed at conductive layers for the gate. That is it is difficult to completely fill in the spaces between the pillar structures with the conductive layers because of the presence of the neck parts. As a result, of conventionally forming a conductive layer for gates, voids can be produced in these spaces. Furthermore, when subsequently etching these conductive layers for gates, adjacent portions of the semiconductor substrate for gates are prone to being lost. As a result fabricating the vertical transistors with conventional techniques, the performance characteristics of the resultant semiconductor devices are likely to be degraded.

BRIEF SUMMARY OF THE INVENTION

Embodiments of the present invention are directed to a semiconductor device which can aid in stabilizing a process for forming a vertical transistor and a method for manufacturing the same.

Also, embodiments of the present invention are directed to a semiconductor device which can improve the performance characteristics and the reliability of the resultant semiconductor device and a method for manufacturing the same.

In one embodiment of the present invention, a semiconductor device comprises a semiconductor substrate having pillar structures which have substantially flat side surfaces; spacers formed on sidewalls of upper portions of the pillar structures; and gates formed to surround lower portions of the pillar structures.

The pillar structures are preferably about 1,000~3,000 Å height.

The spacers are preferably about 50~250 Å thick.

The gates preferably comprise a metal layer.

The semiconductor device may also further comprises buried bit lines formed in portions of the semiconductor substrate between the pillar structures.

In another embodiment of the present invention, a method for manufacturing a semiconductor device comprises the steps of forming pillar structures in a semiconductor substrate; forming a first sacrificial layer over portions of the semiconductor substrate between the pillar structures such that upper portions of the pillar structures are exposed and lower portions of the pillar structures are covered; forming spacers over sidewalls of the upper portions of the pillar structures; removing the first sacrificial layer; forming a metal layer to surround the pillar structures including the spacers; forming a second sacrificial layer on the metal layer to fill the lower portions of between the pillar structures; etching primarily the metal layer such that the spacers are exposed; removing the second sacrificial layer; and forming gates to surround the portions of the pillar structures under the spacers, by etching secondarily the primarily etched metal layer.

The step of forming the pillar structures in the semiconductor substrate comprises the steps of forming sequentially an oxide layer and a nitride layer on the semiconductor substrate; forming hard masks by etching the nitride layer and the oxide layer to expose portions of the semiconductor substrate; and etching the exposed portions of the semiconductor substrate using the hard masks as etch barriers.

The pillar structures are preferably formed to have substantially flat side surfaces.

The pillar structures are preferably formed to have a height of about 1,000~3,000 Å.

After the step of forming the pillar structures and before the step of forming the first sacrificial layer, the method may also further comprise the step of forming buried bit lines in portions of the semiconductor substrate between the pillar structures.

The first and second sacrificial layers are preferably formed as flowable oxide layers.

The flowable oxide layers comprise SOD (spin-on dielectric) layers or BPSG (borophosphosilicate glass) layers.

The spacers are preferably formed at a thickness of about 50~250 Å.

After the step of forming the spacers and before the step of forming the metal layer, the method may also further comprise the step of forming a gate insulation layer on surfaces of the pillar structures.

The metal layer is formed as a single layer of a TiN layer or a TaN layer or a stacked layer composed of a TiN layer and a TaN layer.

The metal layer is preferably formed at a thickness of about 50~200 Å.

DESCRIPTION OF SPECIFIC EMBODIMENTS

Hereafter, specific embodiments of the present invention will be described in detail with reference to the accompanying drawings. It is understood herein that the drawings are not necessarily to scale and in some instances proportions may have been exaggerated in order to more clearly depict certain features of the invention.

Figure 1:
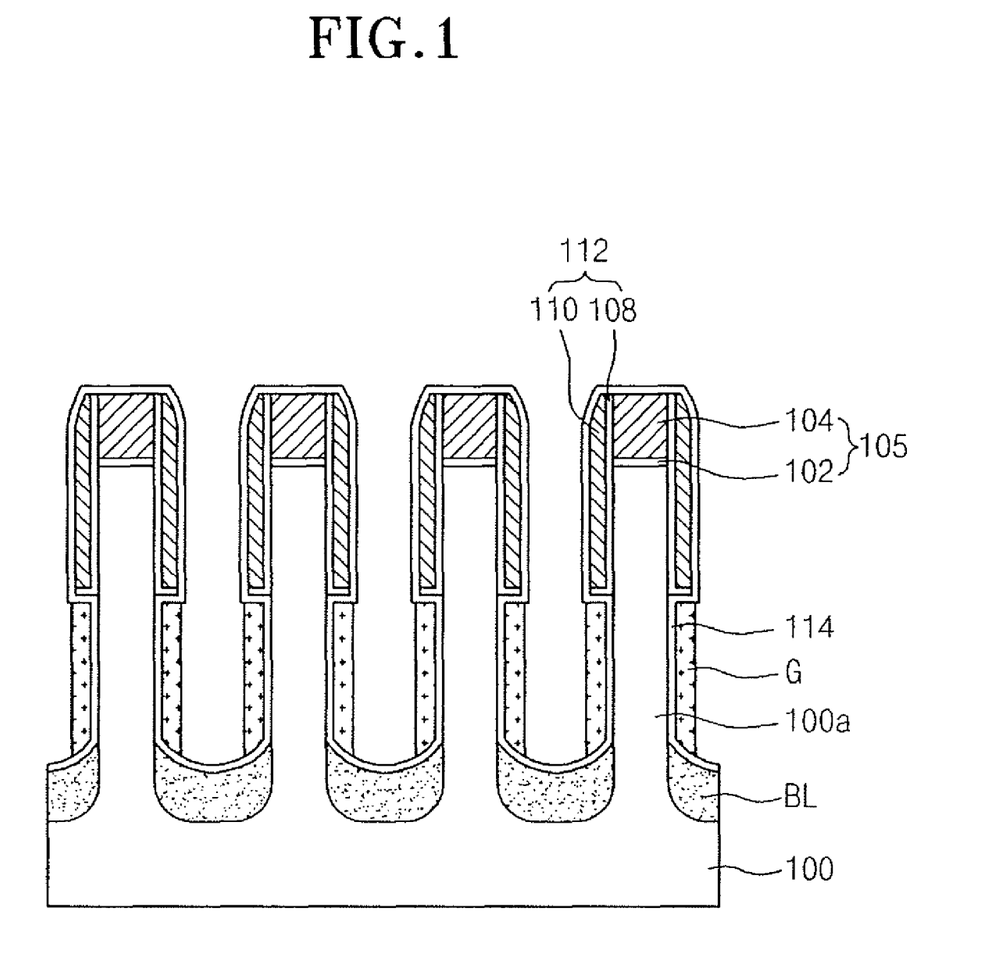
FIG. 1 is a sectional view illustrating a semiconductor device in accordance with a first embodiment of the present invention.

FIG. 1 is a sectional view illustrating a semiconductor device in accordance with a first embodiment of the present invention.

Referring to FIG. 1, pillar structures 100a having hard masks 105 are formed on a semiconductor substrate 100. For example, the hard masks 105 have the stack structure of an oxide layer 102 and a nitride layer 104. The pillar structures 100a according to the embodiment of the present invention have substantially flat side surfaces. Spacers 112 are formed on the upper portions of the pillar structures 100a, and gates G are formed on the lower portions of the pillar structures 100a in such a way as to surround the sidewalls of the pillar structures 100a under the spacers 112. The spacers 112 include an oxide layer 108 and a nitride layer 110.

Therefore, the semiconductor device in accordance with the first embodiment of the present invention has the pillar structures having substantially flat side surfaces instead of the conventional pillar structures that have tapered neck portions. It is possible to prevent or at least protect against unwanted leaning of the pillar structures because of the absence of the tapered neck parts. It is also possible to prevent or at least protect against unwanted voids from being produced in spaces between the pillar structures when forming the conductive layer which is subsequently used to form gates. As a result, the reliability of the semiconductor device made from the present method can be improved.

Moreover, in accordance with the first embodiment of the present invention, as will be described later, since the spacers are used as etch barriers, it is not necessary to form a thick nitride layer. As a result the processing margin can be more easily secured when forming the nitride layer.

In FIG. 1, the reference numeral BL designates buried bit lines, and reference number 114 denotes the gate insulation layer.

FIGS. 2A through 2L are sectional views illustrating the processes of a method for manufacturing a semiconductor device in accordance with a second embodiment of the present invention. The method will be described below.

Figure 2A:
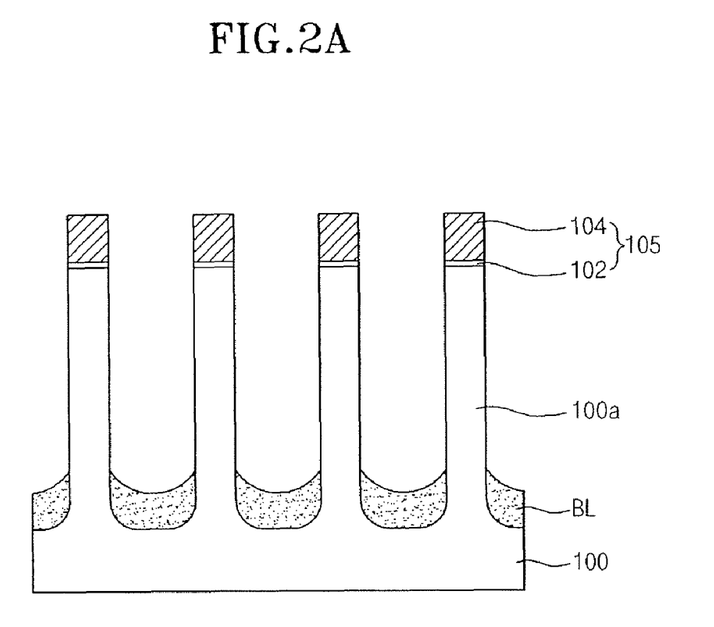
FIGS. 2A through 2L are sectional views illustrating the processes of a method for manufacturing a semiconductor device in accordance with a second embodiment of the present invention.

Referring now to FIG. 2A, an oxide layer 102 and a nitride layer 104 are shown sequentially formed on a semiconductor substrate 100. The nitride layer 104 preferably has a thickness of about 500~1,000 Å which is less than about 1,500 Å as compared to the conventional arts. The hard masks 105 is are formed by selectively etching the nitride layer 104 and the oxide layer 102 which exposes portions of the semiconductor substrate 100.

Pillar structures 100a having substantially flat side to surfaces are next formed by anisotropically etching into exposed portions of the semiconductor substrate 100 which uses the hard masks 105 as etch mask barriers. The pillar structures 100a are preferably formed to have a height of, for example, 1,000~3,000 Å. Preferably, the pillar structures 100a are formed to have a height of about 1,500~2,000 Å.

Since the pillar structures 100a have the flat side surfaces, it is possible to prevent or at least minimize the occurrence of voids being formed because of the absence of tapered neck parts. Because of this, the occurrence of defects brought about by partial loss of the semiconductor substrate can also be prevented or protected against. Therefore, the resultant semiconductor having vertical transistors of the present invention, the performance reliability can be improved. Also, since the thickness of the nitride layer 104 can be decreased compared to the conventional art, it is possible to prevent or at least protect against leaning of pillar structures 100a because the nitride layer is thinner.

Next, by implanting phosphorus (P) or arsenic (As) ions at a doping concentration of about $1.0 \times 10^{15}$ ions/cm$^2$ into the resultant semiconductor substrate 100 formed with the pillar structures 100a, then buried bit lines BL are formed in portions of the semiconductor substrate 100 between the pillar structures 100a. It is also envisioned that the buried bit lines BL can be formed using metal silicides, such as TiSi$_x$, CoSi$_x$ and NiSi$_x$, in order to provide a low interfacial resistance.

Figure 2B:
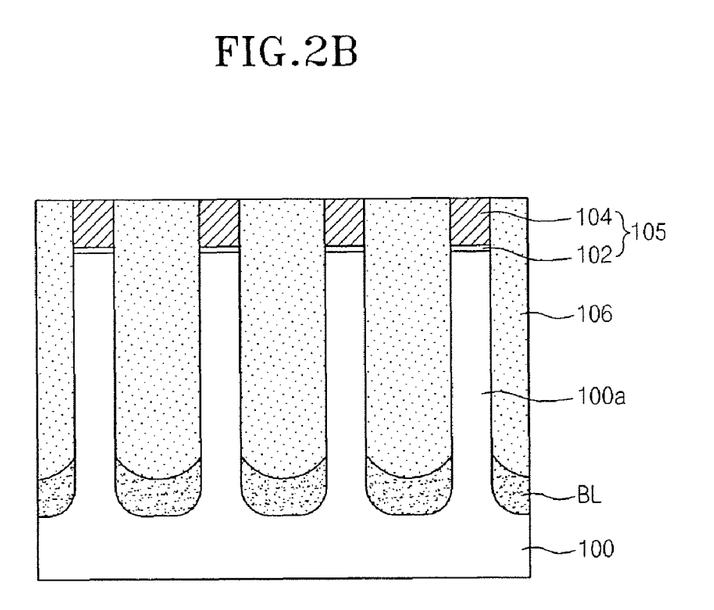

Referring now to FIG. 2B, a first sacrificial layer 106 is formed over the resultant semiconductor substrate 100 that has the hard masks 105 and the buried bit lines BL. The first sacrificial layer 106 is preferably formed as a flowable insulation layer that exhibits excellent gap-fill characteristics. The flowable insulation layer of the first sacrificial layer 106 can be a SOD (spin-on dielectric) layer or a BPSG (borophosphosilicate glass) layer at a thickness of about 3,000~6,000 Å. A top portion of the first sacrificial layer 106 is then removed, for example, using a CMP process until the hard masks 105 are exposed.

Figure 2C:
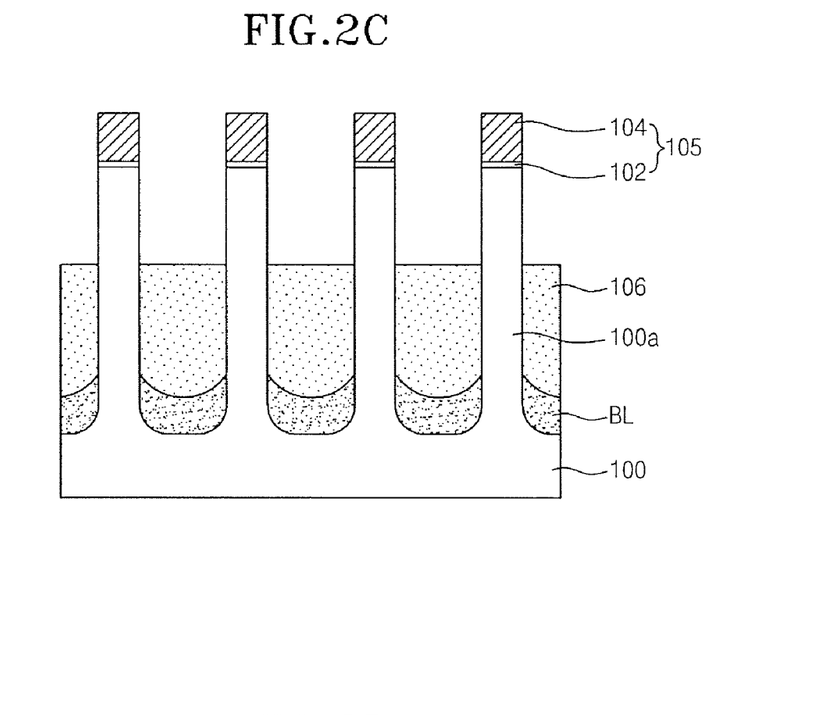

Referring now to FIG. 2C, the first sacrificial layer 106 is then preferably wet-etched in order to expose the hard masks 105 and the upper portions of the pillar structures 100a. The wet etching is preferably conducted using an HF solution. As a result, the remaining portion of the first sacrificial layer 106 has a thickness that covers the lower portions of the pillar structures 100a.

Figure 2D:
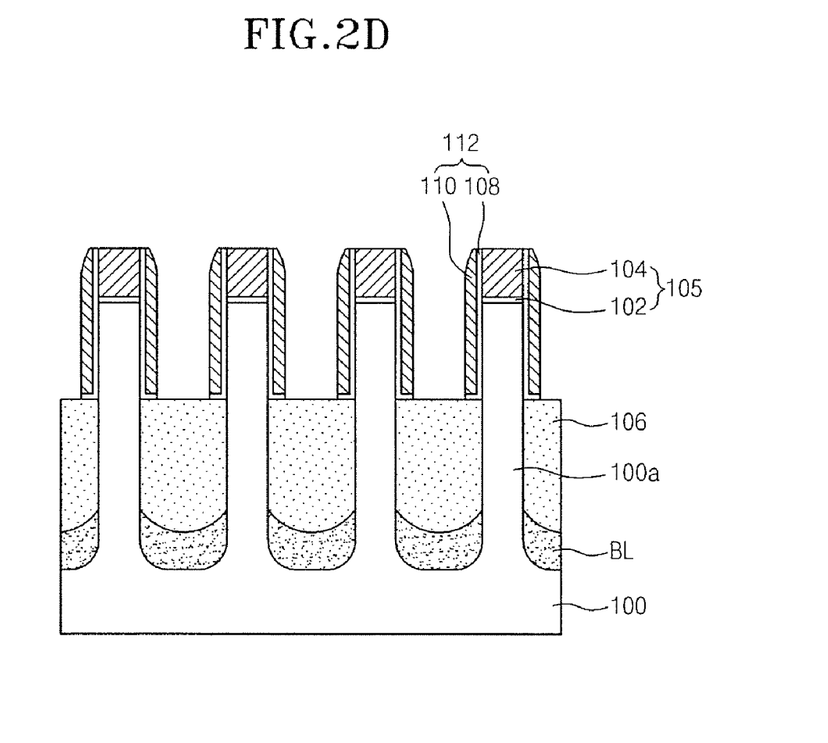

Referring now to FIG. 2D, an oxide layer 108 and a nitride layer 110 are sequentially formed over the remaining first sacrificial layer 106, over the exposed hard masks 105 and over the exposed pillar structures 100a. The nitride layer 110 is preferably formed at a thickness of about 50~250 Å. Spacers 112 are then formed over the sidewalls of the upper portions of the pillar structures 100a by etching the nitride layer 110 and the oxide layer 108. The oxide layer 108 of the spacers 112 can remain over the upper surfaces of the hard masks 105 and over the remaining first sacrificial layer 106.

Figure 2E:
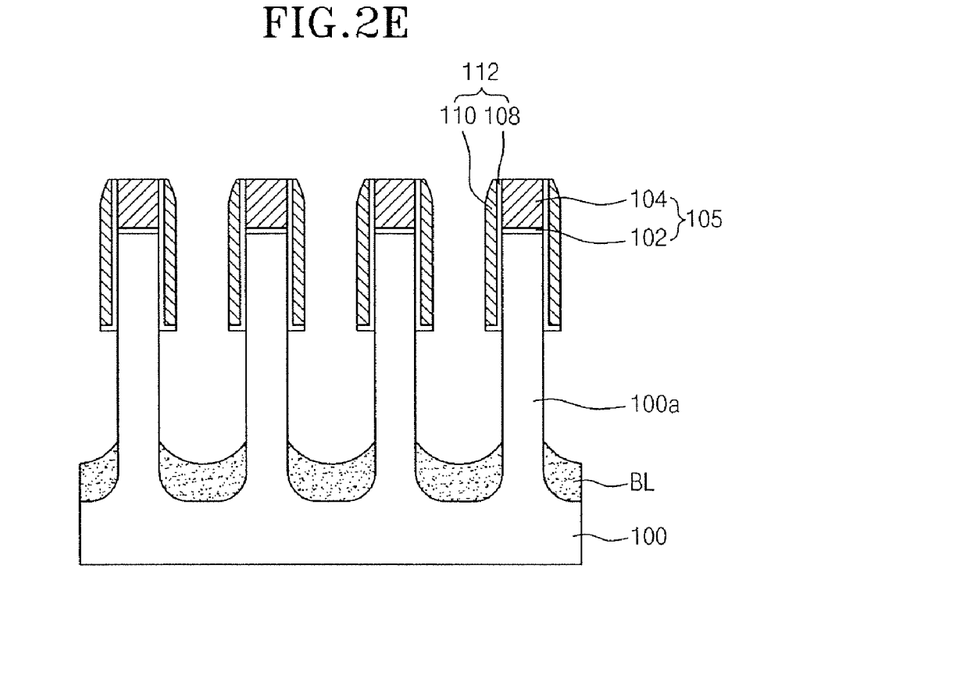

Referring now to FIG. 2E, the remaining portion of the first sacrificial layer 106 is subsequently removed from the resultant semiconductor substrate 100 which has the spacers 112. The removal of the first sacrificial layer 106 is preferably conducted using wet etching with an HF solution.

Figure 2F:
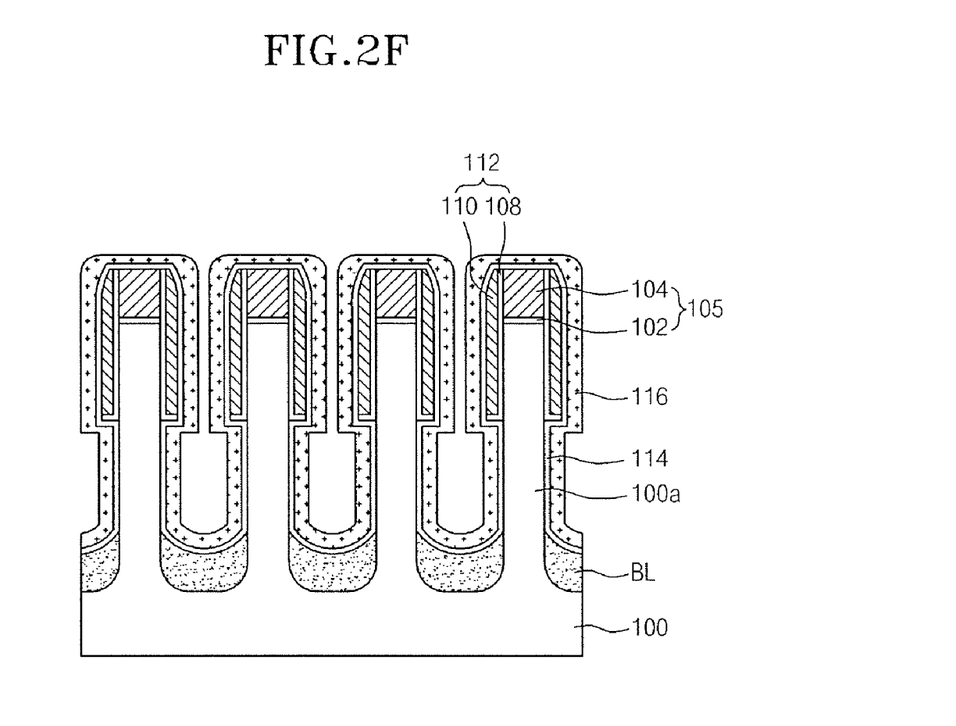

Referring now to FIG. 2F, a gate insulation layer 114 is formed over the resultant semiconductor substrate 100 that has the spacers 112 and the pillar structures 100a. The gate insulation layer 114 is formed as an oxide layer at a thickness of about 30~80 Å by using, for example, a thermal oxidation process or a radical oxidation process. A metal layer 116 is next formed over the gate insulation layer 114 for use as a gate conductive layer having a profile matching that of the gate insulation layer 114. The metal layer 116 is formed at a thickness that does not completely fill the spaces between the lower portions of the pillar structures 100a. The metal layer 116 preferably has a thickness of about 50~200 Å. The metal layer 116 may be formed as a single layer of a TiN layer or a TaN layer or even as a stack composed of a TiN layer and a TaN layer.

Figure 2G:
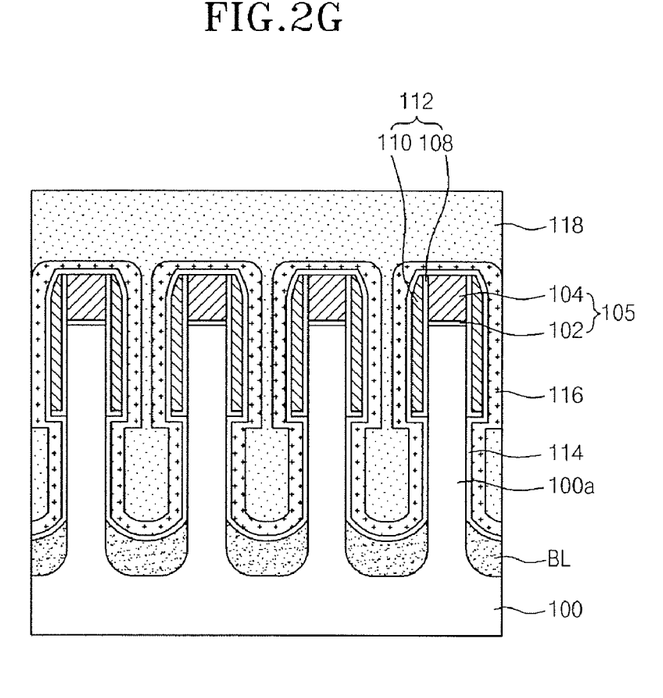

Referring to now FIG. 2G, a second sacrificial layer 118 is formed on the metal layer 116, preferably, to a thickness of 500~6,000 Å, in such a way as to completely fill the spaces between the pillar structures 100a. The second sacrificial layer 118 is formed as an oxide layer such as an HDP (high density plasma) oxide layer, a BPSG (borophosphosilicate glass) oxide layer, an SOD (spin-on dielectric) oxide layer, a TEOS (tetraethylorthosilicate) oxide layer, a USG (undoped silicate glass) oxide layer and an ALD (atomic layer deposition) oxide layer. Preferably, the second sacrificial layer 118 is formed as a flowable oxide layer such as the SOD oxide layer and the BPSG oxide layer.

Figure 2H:
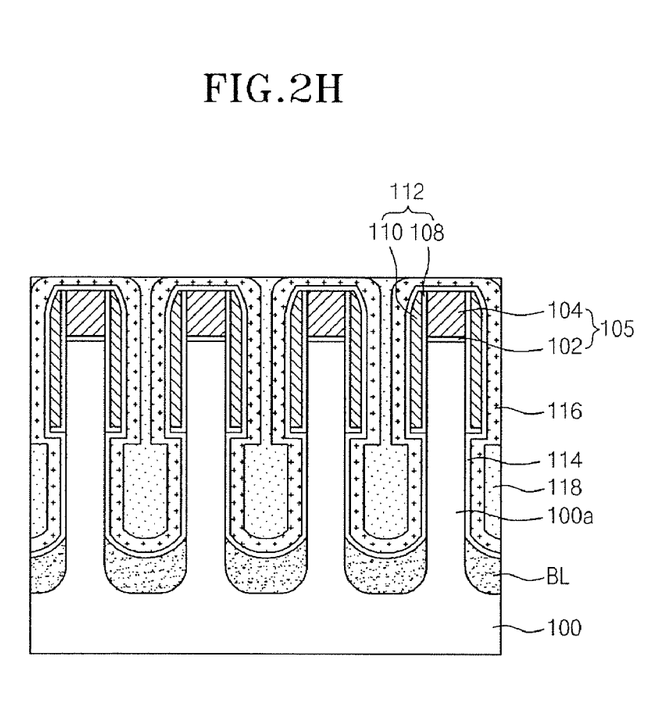

Referring now to FIG. 2H, a top portion of the second sacrificial layer 118 is removed so that the metal layer 116 is exposed. The partial removal of the second sacrificial layer 118 is preferably implemented using a CMP process or an etch-back process. Preferably, the partial removal of the second sacrificial layer 118 is implemented through a CMP process using silica slurry or ceria slurry.

In the embodiment of the present invention, it is preferred that the CMP process is conducted using slurry for allowing an oxide layer to be polished faster than a metal layer. That is the CMP process is preferred to have a polishing selectivity of about 1:40 between the metal layer and the oxide layer. Since the metal layer 116 is not substantially removed when performing the CMP process, the evenness of the surface of the metal layer 116, which is exposed after the CMP process, can be improved.

Also, in the embodiment of the present invention, the metal layer 116 is used as a conductive layer for gates instead of using a polysilicon layer as in the conventional art. As a result it is possible to minimize the loss of the nitride layer 104 of the hard masks 105 when subsequently removing the second sacrificial layer 118. By doing this, in the present invention, it is not necessary to form the nitride layer 104 as thick as is used in the conventional art. As a result, the processing margin for the nitride layer 104 in a subsequent process can be more easily secured.

Figure 2I:
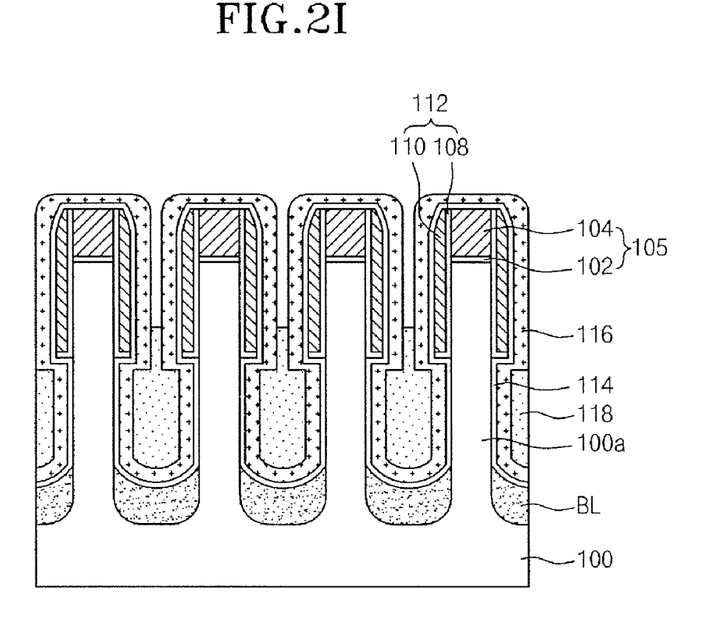

Referring now to FIG. 2I, the CMPed second sacrificial layer 118 is then etched to expose portions of the metal layer 116 which are formed on the spacers 112. Preferably, the second sacrificial layer 118 is only partially etched so that the second sacrificial layer 118 remains up along the side surface portions of the pillar structures 100a from which channels (not shown) are to be defined.

Figure 2J:
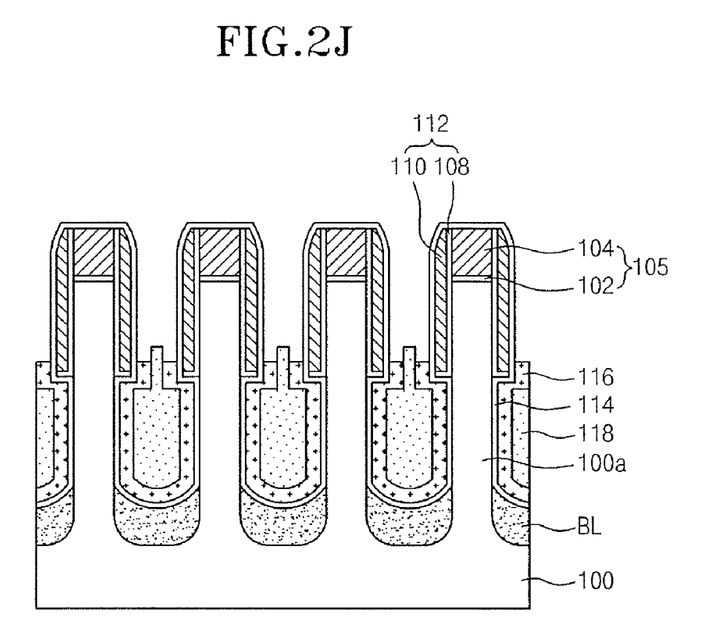

Referring now to FIG. 2J, the exposed portions of the metal layer 116 are selectively etched. The selective etching of the metal layer 116 is implemented using a wet etching process, for example, $H_2SO_4$ chemical etching process. It is conceivable that the selective etching of the metal layer 116 can be implemented using a dry etching process such as etch-back, and in this case, advantages can be realized in that the uniformity of the remaining metal layer 116 is increased.

In the embodiment of the present invention, etching of the metal layer 116 is implemented so that only the metal layer 116 is selectively removed. Accordingly, when selectively etching the metal layer 116, nitride layer 104 loss can be suppressed or minimized. Therefore, in the present invention, the processing margin for the nitride layer 104 in a subsequent process can be secured, and as a result it is not necessary to form the nitride layer 104 to be thick as in the conventional art.

Figure 2K:
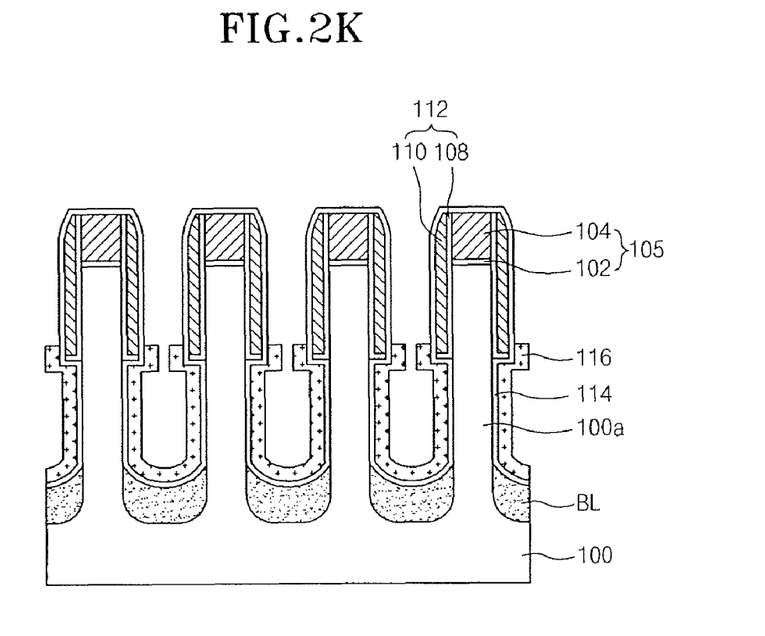

Referring now to FIG. 2K, the remaining portion of second sacrificial layer 118 is removed from the resultant semiconductor substrate 100 which has the selectively etched metal layer 116. The removal of the second sacrificial layer 118 is preferably implemented with a wet etching technique using an HF solution.

Figure 2L:
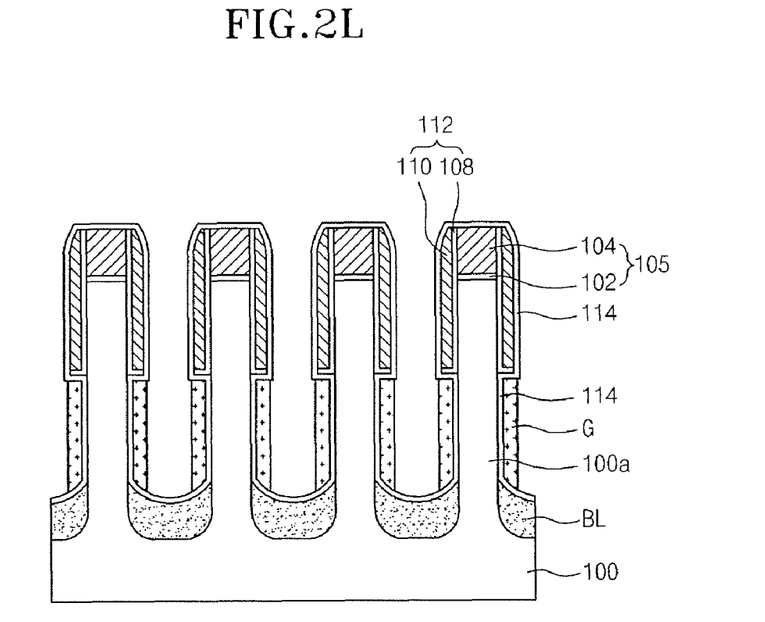

Referring to FIG. 2L, gates G are formed on the lower portions of the pillar structures 100a by dry-etching the metal layer 116 so that the gates G surround the outer surfaces of the lower portions of the pillar structures 100a under the spacers 112. It is preferred that the dry etching be implemented using an etch-back technique so that the gates G remain on the lower portions of the pillar structures 100a under the spacers 112.

In the embodiment of the present invention, due to the fact that the gates G are formed by etching the metal layer 116 in a state in which the spacers 112 are formed on the upper portions of the pillar structures 100a, the gates G can be formed only on the lower portions of the pillar structures 100a under the spacers 112 including portions in which channels are defined. Thus, in the present invention, a processing margin for the nitride layer 104 can be secured, and the gates G can be formed at desired positions by employing the spacers 112.

Thereafter, while not shown in a drawing, by sequentially conducting a series of well-known subsequent processes, the manufacture of a semiconductor device according to the embodiment of the present invention is completed.

As is apparent from the above description, in the present invention, since pillar structures have flat side surfaces, it is possible to prevent voids from being produced in spaces between the pillar structures while conducting a subsequent process. It is also possible to prevent a semiconductor substrate from being partially lost when etching a gate conductive layer so as to form gates.

In addition, in the present invention, when an etching process and a CMP process are conducted so as to form vertical transistors, not only a nitride layer for hard masks but also spacers formed on the sidewalls of the upper portions of the pillar structures having the flat side surfaces and a conductive layer for gates are used as barriers. Due to this fact, it is not necessary to form the nitride layer for hard masks to be thick as in the conventional art, and accordingly, a processing margin of the nitride layer when conducting a subsequent process can be sufficiently secured. Therefore, in the present invention, it is possible to prevent the pillar structures from leaning, whereby processes for forming vertical transistors can be stabilized and the characteristics and the reliability of a semiconductor device can be improved.

Although specific embodiments of the present invention have been described for illustrative purposes, those skilled in the art will appreciate that various modifications, additions and substitutions are possible, without departing from the scope and the spirit of the invention as disclosed in the accompanying claims.

What is claimed is:

1. A method for manufacturing a semiconductor device, comprising the steps of:

etching a semiconductor substrate to form pillar structures in the semiconductor substrate;

forming a first sacrificial layer over portions of the semiconductor substrate between the pillar structures so that upper portions of the pillar structures are exposed and lower portions of the pillar structures are covered;

forming spacers over sidewalls of the upper portions of the pillar structures;

removing the first sacrificial layer;

forming a metal layer so that the metal layer surrounds the pillar structures which has the spacers;

forming a second sacrificial layer on the metal layer to substantially fill the lower portions of between the pillar structures;

etching primarily the metal layer to expose the spacers;

removing the second sacrificial layer; and forming gates that substantially surround the portions of the pillar structures under the spacers by etching the etched metal layer.

2. The method according to claim 1, wherein forming the pillar structures in the semiconductor substrate comprises the steps of:

forming sequentially an oxide layer and a nitride layer over the semiconductor substrate;

etching the nitride layer and the oxide layer to form hard masks that expose portions of the semiconductor substrate; and etching the exposed portions of the semiconductor substrate using the hard masks as etch barriers.

3. The method according to claim 1, wherein the pillar structures are formed to have substantially flat side surfaces.

4. The method according to claim 1, wherein the pillar structures are formed at about 1,000~3,000 Å thick.

5. The method according to claim 1, further comprises the step of forming buried bit lines in portions of the semiconductor substrate between the pillar structures, wherein forming the BL is performed after the pillar structures are formed and before forming the first sacrificial layer.

6. The method according to claim 1, wherein the first and second sacrificial layers are formed as flowable oxide layers.

7. The method according to claim 6, wherein the flowable oxide layers comprise SOD (spin-on dielectric) layers or BPSG (borophosphosilicate glass) layers.

8. The method according to claim 1, wherein the spacers are formed at a thickness of about 50~250 Å.

9. The method according to claim 1, further comprises the step of forming a gate insulation layer on surfaces of the pillar structures wherein forming the gate insulation layer is preformed after forming the spacers and before forming the metal layer.

10. The method according to claim 1, wherein the metal layer is formed as a single layer of a TiN layer or a TaN layer or a stack comprising the TiN layer and the TaN layer.

11. The method according to claim 1, wherein the metal layer is formed at a thickness of about 50~200 Å.

* * * * *